US006434308B1

(12) United States Patent
Trezza

(10) Patent No.: US 6,434,308 B1
(45) Date of Patent: Aug. 13, 2002

(54) OPTOELECTRONIC CONNECTOR SYSTEM

(75) Inventor: John A. Trezza, Nashua, NH (US)

(73) Assignee: Teraconnect, Inc, Nashua, NH (US)

( * ) Notice: Subject to any disclaimer, the term of this patent is extended or adjusted under 35 U.S.C. 154(b) by 0 days.

(21) Appl. No.: 09/653,647

(22) Filed: Sep. 1, 2000

Related U.S. Application Data

(60) Provisional application No. 60/159,165, filed on Oct. 13, 1999, provisional application No. 60/152,244, filed on Sep. 3, 1999, and provisional application No. 60/152,213, filed on Sep. 3, 1999.

(51) Int. Cl.[7] .............................. G02B 6/06; H04B 10/00
(52) U.S. Cl. ........................... 385/119; 385/33; 385/88; 385/89; 385/115; 385/116; 359/152; 359/173
(58) Field of Search ............................... 385/33, 34, 88, 385/89, 92, 115, 116, 119; 359/152, 173

(56) References Cited

U.S. PATENT DOCUMENTS

| | | | |
|---|---|---|---|
| 4,862,231 A | 8/1989 | Abend | 359/19 |
| 5,054,870 A | 10/1991 | Losch et al. | 385/14 |
| 5,119,451 A | 6/1992 | Wills et al. | 385/14 |
| 5,420,954 A | 5/1995 | Swirhun et al. | 385/92 |
| 5,557,693 A | 9/1996 | Stevens et al. | 385/24 |
| 5,631,988 A | 5/1997 | Swirhun et al. | 385/89 |
| 5,858,814 A | 1/1999 | Goossen et al. | 438/107 |
| 5,913,002 A | * 6/1999 | Jiang | 385/88 |
| 5,959,752 A | * 9/1999 | Ota | 359/152 |
| 6,052,498 A | 4/2000 | Paniccia | 385/14 |

FOREIGN PATENT DOCUMENTS

| | | | | |
|---|---|---|---|---|
| JP | | 5088028 | 4/1993 | 385/14 |

OTHER PUBLICATIONS

PCT International Search Report dated Mar. 14, 2001 of International Application No. PCT/US00/24134 filed Sep. 1, 2001.
M. Ajmone Marsan et al, Modelling Slotted Multi–Channel Ring All–Optical Networks, *IEEE*, 1997, p. 146–153.
Marco Ajmone Marsan et al, Access Protocols for Photonic WDM Multi–Rings with Tunable Transmitters and Fixed Receivers, *SPIE*, pp. 59–72, vol. 26921.
Carl Beckmann, Applications: Asynchronous Transfer Mode and Synchronous Optical Network, *Handbook of Fiber Optic Data Communication*, 1998, pp. 385–414, Academic Press.
Floyd E. Ross, An Overview of FDDI: The Fiber Distributed Data Interface, *IEEE Journal on Selected Areas in Communications*, Sep. 1989, pp. 1043–1051, vol. 7 No. 7.

* cited by examiner

*Primary Examiner*—Brian Healy
*Assistant Examiner*—Sarah Woo
(74) *Attorney, Agent, or Firm*—Scott J. Asmus; Vernon C. Maine; Maine & Asmus

(57) ABSTRACT

An optical transceiver system including a plurality of transceiver nodes with at least one two-dimensional integrated circuit array of optical emitters and detectors mounted on an ASIC drive circuit and forming a focal plane; a lens or light collimator located adjacent for directing light to and from the emitter and detectors; an epoxy stand off located peripherally around each focal plane to prevent contact between the focal plane and the lens or collimator and to prevent entry of contaminants therebetween; and at least one fiber optic bundle to convey light between each of the transceiver nodes through the perspective lenses or collimators.

18 Claims, 4 Drawing Sheets

OPTOELECTRONIC CONNECTOR SYSTEM

RELATED APPLICATIONS

This application claims priority to Provisional Patent Application Ser. No. 60/152,213 filed Sep. 3, 1999; No. 60/152,244 filed Sep. 3, 1999; No. 60/159,165 filed Oct. 13, 1999. Utility Patent Application entitled "Method of Equalizing Device Heights on a Chip", John A. Trezza, U.S. Ser. No. 09/654,425 (now U.S. Pat. No. 6,316,286)is incorporated by reference.

FIELD OF THE INVENTION

This invention relates to optical communication systems and more particularly to a fiber optic cable and transceiver connector system utilizing a coherent bundle of optical fibers, or image guide, or ordered fiber array.

BACKGROUND OF INVENTION

Optical couplers are now used to communicate optical signals over short and long distances between, for example, two computers, two circuit boards in one computer, and even two different chips on the same circuit board. Communications of this type are also disclosed in a co-pending patent application filed on even date herewith, entitled "Optical Communication Network with Receiver Reserved Channel", Timothy P. Boggess and John A. Trezza, incorporated herein by reference.

The technology associated with electronics has evolved extremely rapidly over the last 40 years. Computers and related peripheral equipment, satellite, and communication systems are becoming ever more sophisticated and powerful. A key factor leading to every increasing demand for faster data transfer rates is the need to perform tasks that are highly complex. Such tasks include digital signal processing, image analysis, and communications.

Data transfer, however, remains a gating capability. This issue holds true for data transfer within an integrated circuit, from one chip to another, from hybrid circuit to hybrid circuit, from one integrated circuit board to another integrated circuit board, and from system to system.

Increasing the data transfer rate can be done in any of several ways. Originally, the scheme used was to increase the number of data transfer lines, i.e., transfer the data in parallel. The historical progression according to this scheme has been in powers of two: The first real integrated circuits had 4 bit buses; next came 8 bit buses, which were then superceded by 16 bit buses; currently, 32 bit buses are the standard; and 64 bit buses are in development.

Such increases have typically come in two phases. In the first phase, a factor of two increases in the number of bits being processed takes place within the chip. Then, as the technology matures, the number of bits on the bus off the chip increases. Under such an approach, there is always a greater processing capability available on a chip than off it, and so, unfortunately, advances in chip design must wait for the rest of the system to catch up.

Accelerated development of wider bit buses (e.g. 128, 256, etc.) has been impeded by several factors including the practical limitation on the size of the mechanical connectors, the noise inherent in the signals arriving nearly simultaneously, the reliability of wide pin connectors, and the power required to drive multiple lines off-chip. As a result, many of today's successful networks are serial or relatively narrow (e.g., Gigabyte Ethernet or Myrinet) and transmitted over a single co-axial cable or possibly a single pair of optical fibers.

Another approach is to simply increase the speed with which the information is processed. Early microprocessors functioned at 4 MHz, and, with each succeeding year, the raw speed of microprocessors increases. Currently, processor speeds in excess of 400 MHz are common and processors with speeds in excess of 1 GHz are in the offing.

Increasing the processor speed is not without challenges, however, because increasing the speed also increases power requirements, introduces skew problems across the channel, and usually requires more exotic processing than is standard practice. Combining the two approaches, i.e., making wide and fast networks, is difficult because the combination of the problems inherent in each approach is overwhelming for existing technologies.

In response, integrated circuit technology that enables bi-directional, high-speed optical rather than electrical interconnections has been developed. This technology allows laser emitters and detectors to be integrated onto a semiconductor substrate, making electrical connection with electronic circuitry previously built on that substrate.

Thus, optical rather than electrical communications between electronic devices is accomplished. An optical transmitter-receiver module typically includes both light emitting devices such as vertical cavity surface emitting lasers (VCSELS) and light detecting devices such as photodiodes. Such a module may include separate chips, or more typically, the VCSELS and the photodiodes are grown on the same substrate. See U.S. Pat. No. 5,978,401 incorporated herein by this reference.

Driver-receiver circuitry modules, typically in the form of ASIC chips, include driver circuitry which receives electrical signals from one electronic device and which, in response, drives the VCSELS accordingly. The ASIC also includes receiver circuitry for receiving signals from the photodiodes and, in response, processes those electrical signals providing an appropriate output to the associated electronic device.

The combination of the VCSELS and the photodiodes and the ASIC circuitry is typically called an optical transceiver. One way to hybridize the VCSELS and the photodiodes and the ASIC receiver circuitry is by flip-chip bonding. See U.S. Pat. No. 5,858,814, incorporated herein by this reference.

A fiber optic cable then has one end connected to one transceiver and the other end connected to another transceiver via optical connectors.

As the density of the arrays of emitters and detectors increases, coupling a fiber optic cable to these arrays becomes an increasingly arduous task. Design considerations include properly aligning the active area of each emitter and detector with a particular fiber of the fiber optic bundle, fashioning reliable removable connectors which maintain alignment over repeated coupling and decoupling of the optical fiber bundle to the arrays, accommodating for the circuitry and wiring electrically connecting the arrays to other circuitry, keeping the arrays clean, manufacturing studies to insure that the cost of such couplers is not prohibitive and that they are not unduly complex, and insuring that when the coupler is removed from its transceiver, laser light emitted by the arrays of the transceiver does not harm the eyes of personnel in close proximity to the transceiver.

SUMMARY OF THE INVENTION

One of the problems with transmission of optical data signals from an array of sources through fiber-optic strands is that it requires a time consuming and costly coupling of both the sources and the detectors to the ends of the fiber-optic strands. That is, it requires a precise physical alignment of the ends of the fiber-optic strands with both the sources and the detectors. With multiple parallel paths, the alignment of the emitter and the fiber optic strands can become both time consuming and costly. With large arrays of emitters and detectors, the connection of individual fibers to corresponding emitters and detectors is impractical.

The method and apparatus described in this disclosure enables many more bits per channel compared to a traditional system, and the system can operate at far lower power due to lower capacitance. In this disclosure, an apparatus is described that allows more than 1000 bits per channel.

The current invention has the advantage of providing a fully integrated, bidirectional, low loss, and very wide optoelectronic bus architecture utilizing a single interconnection means. Other systems generally cannot provide the large bandwidth embodied in the current invention. In data transfer applications, this represents the opportunity to create interconnects with Terabit or higher throughputs.

Another advantage of the present invention is the ability to simultaneously connect millions of parallel channels of data. Traditional interconnect techniques are generally limited to hundreds of simultaneous connections, at most. The present invention represents an order of magnitude increase in connection density.

Another advantage of the current invention is the low dispersion loss provided by the face plate or microlens collimators and image guides. The utilization of microlenses to pre-focus the emitter output reduces dispersion and therefore losses through the interconnect and helps ensure coherent optical transmission from emitter to detector.

This invention features an optical transceiver system including a plurality of transceiver nodes each including at least one two-dimensional, integrated circuit array of optical emitters and detectors mounted on an ASIC drive circuit and forming an optical focal plane. A lens or light collimator is mounted adjacent each focal plane for directing light to and from the individual emitters and detectors of the respective focal plane. An epoxy standoff is located peripherally around each focal plane for preventing contact between the focal plane and the adjacent lens or collimator and for preventing the entry of contaminants therebetween. At least one fiber optic bundle is located to convey light between each of the separate transceiver nodes through the respective lenses or light collimators, wherein the fiber optic bundle has two distal ends each of which is positioned to convey light through a lens or collimator of a separate array focal plane.

In a preferred embodiment, the emitters and detectors are integrated devices fabricated by different processes and have different device heights. The emitters and detectors are mounted adjacently on each ASIC drive circuit to have a common height to form a respective focal plane.

BRIEF DESCRIPTION OF THE INVENTION

Other objects, features and advantages will occur to those skilled in the art from the following description of a preferred embodiment and the accompanying drawings in which.

DISCLOSURE OF PREFERRED EMBODIMENT

Figure 1:
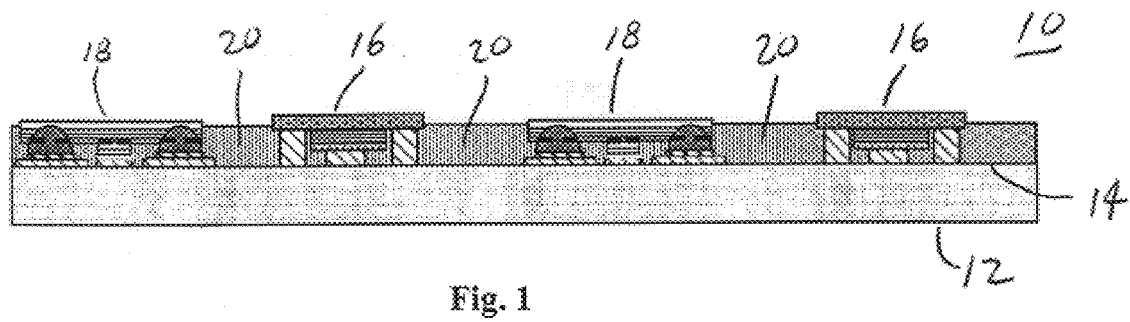
FIG. 1 is a side elevational view of an integrated circuit with emitters and detectors.
Figure 3:
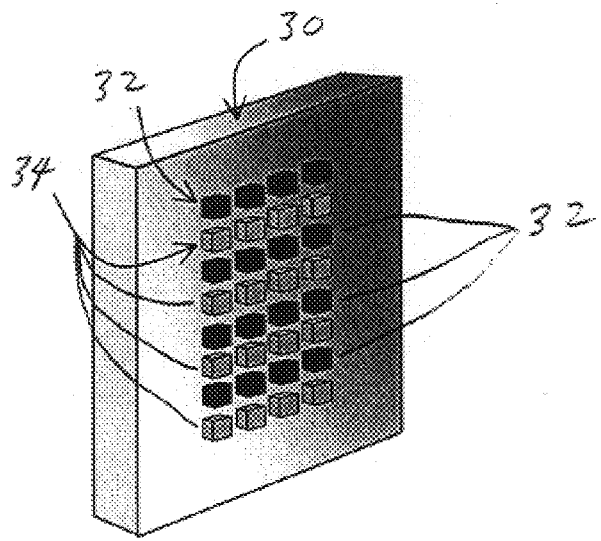
FIG. 3 is a side view of an array of emitters and detectors on a substrate, used in bidirectional connections.

As shown in FIG. 1, an optoelectronic device 10 is provided, consisting of a silicon substrate 12. On the upper surface of substrate 12, alternating detectors 16 and laser emitters 18 are attached with epoxy filler 20 therebetween. Each emitter has a means for electrical connectivity embedded in the chip and connected to the chip substrate and package. Typical emitters may be 10 $\mu$m in size, constructed on 125 $\mu$m centers. Similarly, a detector array is constructed using detectors 50 $\mu$m in size, spaced identically to the emitter array. In FIG. 3, an array of emitters 32 and detectors 34 are attached to substrate 30.

Figure 2A:
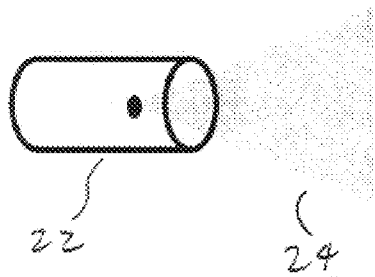
FIGS. 2A and 2B are representative of the uncollimated output of an emitter and the collimated output of an emitter, respectively.
Figure 2B:
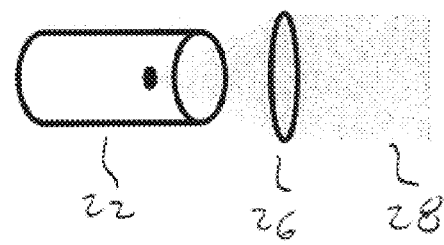

One problem with optical emitters is that the light produced is uncollimated, that is, it will disperse over some angle, as shown in FIG. 2A where emitter 22 produces uncollimated light 24. As shown in FIG. 2B lens 26 can be used to produce collimated light 28. This is useful for transmission both through free space through fiber optic media.

Figure 4:
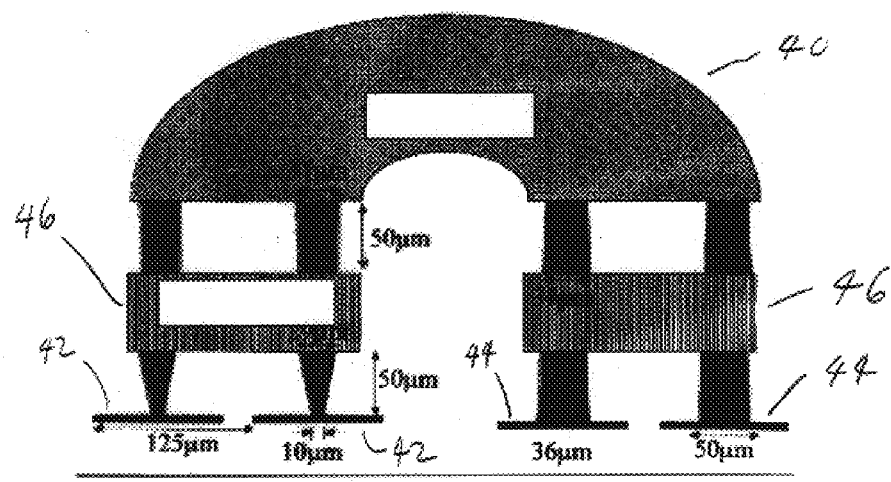
FIG. 4 is a schematic side view of an optoelectronic connector system according to the present invention.
Figure 5A:
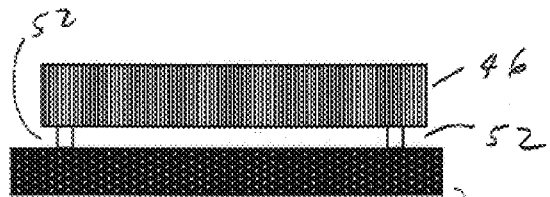
FIGS. 5A and 5B are side and top views, respectively, of a portion of a connector system according to the present invention showing an epoxy standoff.
Figure 5B:
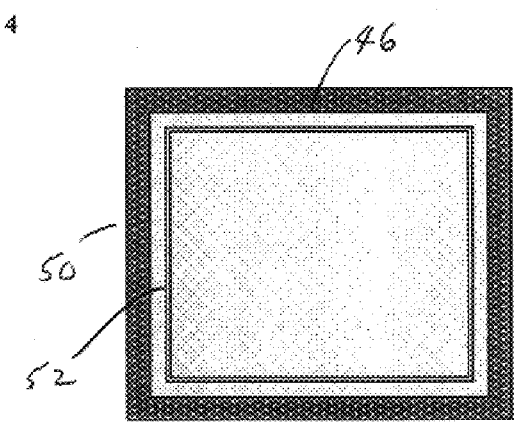

As shown in FIG. 4, the present invention also utilizes a coherent bundle of optical fibers, called an image guide 40, as a transmission medium for digital optical signals. In an image guide, many optical fibers are bonded together in a fixed and coherent manner such that the physical arrangement of fibers at each end of the bundle correspond exactly. Thus, a particular pattern of illumination at one end of the guide will be transmitted to the other end of the bundle with a one to one correspondence. The present invention utilizes an image guide to transmit digital data from an array of emitters 42 on one chip to a corresponding geometrically similar array of detectors 44 on another chip. The image guide can be arranged so that the number of fibers is equal to the number of emitters and detectors or can be such that the number of fibers greatly exceeds the number of emitters and detectors. The former case is an example of an ordered fiber array. Such an ordered fiber array can be realized either as part of the fiber-drawing process or by terminating the desired number of fibers in a precision ferrule or fiber alignment plate to produce the spatial ordering.

In order to provide collimation for the light produced by the emitters 42, a plate 46 containing a plurality of microlenses corresponding to the geometry and distribution of the emitter array is mounted to epoxy standoffs at a height of approximately 50 $\mu$m from the emitters. Alternatively, this plate can consist of a coherent bundle of fibers, a very short image guide, which does not collimate the light, but contains and transmits it to/from the detectors/emitters mounted below. Plate 46 can contain a mixture of microlenses and fiber guides. For simplicity, the examples here show emitters 42 on one chip and detectors 44 on another chip. As shown in FIG. 4, plate 46 is interposed between the CMOS substrate containing the devices and the image guide that transmits the optical signals from emitters 42 to detectors 44.

In a preferred embodiment, plate 46 is attached to an epoxy standoff 52 surrounding the periphery of the array of devices (not shown) on substrate 50. Preferably, standoff 52 maintains plate 46 at a height of 50 μm, and surrounds and protects the array, preventing the flow of glue or other contaminants onto the array. The 50 μm distance is chosen to provide adequate protection for the wafer during the connection process. In practice the smallest distance that would still protect the arrays is the most desirable.

Once the plate is mounted to the array, what is left is a means of optically connecting two such assemblies to enable the optical data bus to be realized. To accomplish this, a six-step process is utilized, as outlined below.

Figure 6:
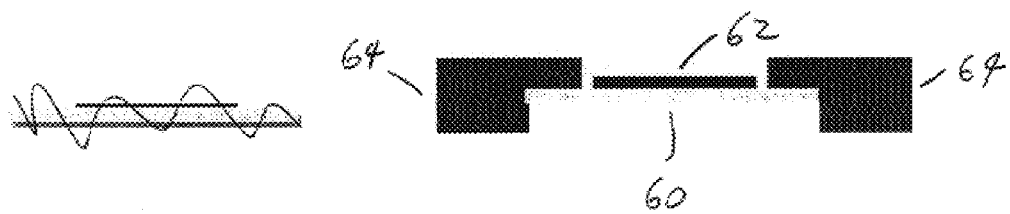
FIG. 6 is a side view of a CMOS substrate with face plate attached to a ceramic electrical package.

Once the integrated circuit wafer is manufactured and the microlens plate 62 attached, wafer 60 is mounted in a conventional ceramic electrical package 64, as shown in FIG. 6. Note that this ceramic electrical package can also consist of a flexible electrical interconnect material that allows the signal to propagate from the top of the CMOS down to a printed circuit board which is below the height of the CMOS chip.

Figure 7:
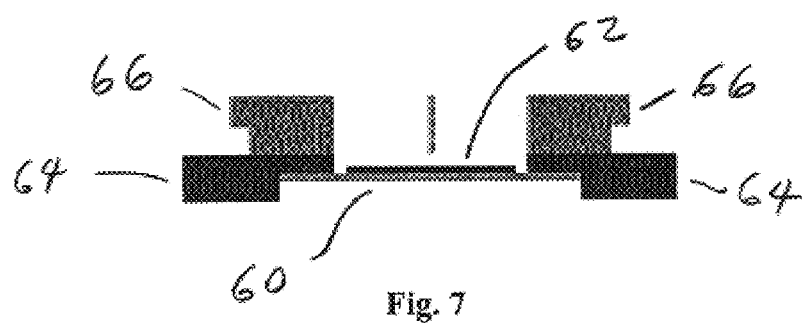
FIG. 7 is the assembly of FIG. 6 with an optical connector base attached.
Figure 8:
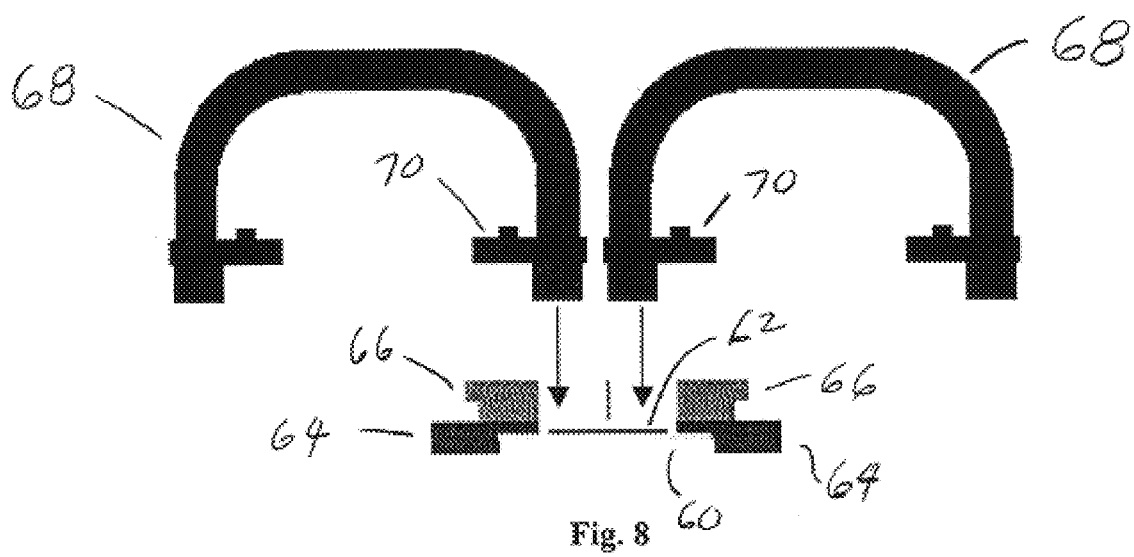
FIG. 8 is a side view of the image guides, mounted in a mating connector, in proximity of, but not connected to, the optical connector base.
Figure 9:
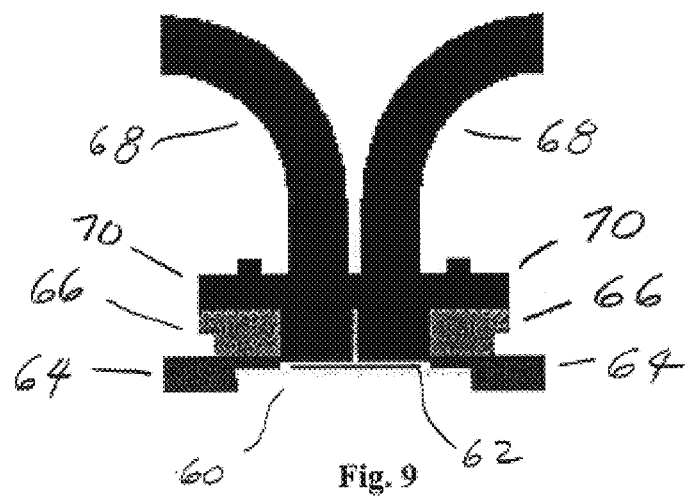
FIG. 9 is a side view of FIG. 8 with the mating connectors mated to the optical connectors.

The base of optical connectors 66 is then attached to ceramic electrical package 64, FIG. 7. The image guides 68, mounted in mating connectors 70, are plugged into optical connectors 66 mounted on ceramic electrical package 64, as shown in FIGS. 8 and 9. Finally, snap connector 72 is utilized to hold the entire assembly together, as shown in FIG. 10.

Figure 10:
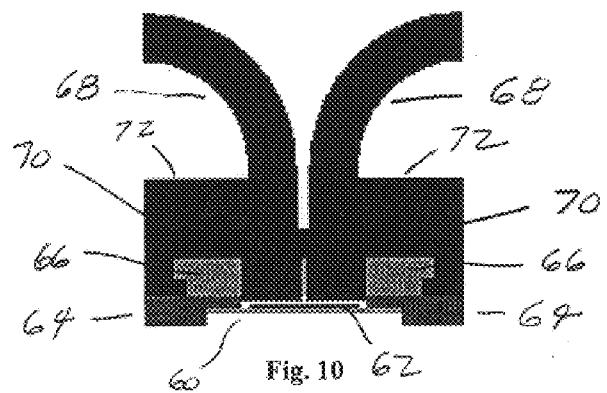
FIG. 10 is a side view of the mated assembly of FIG. 9 with a snap connector to hold the mated components together.
Figures 11A, 11B:
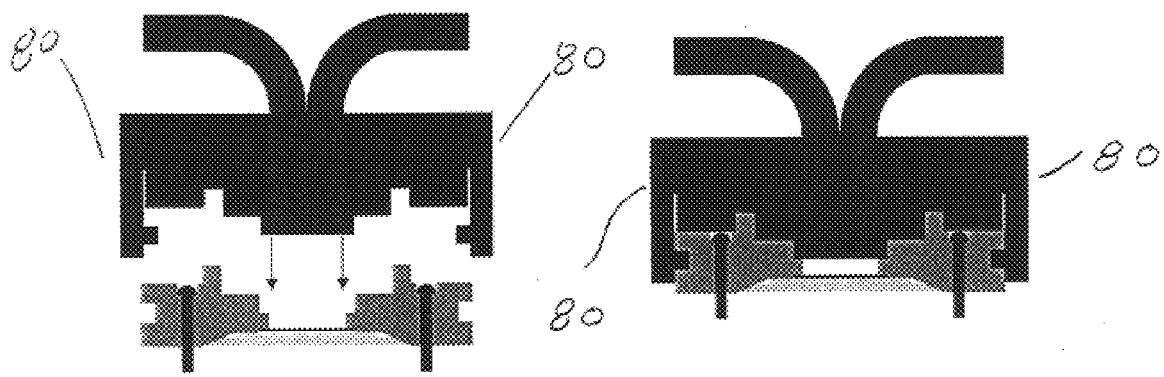
FIGS. 11A and 11B are side views of a simplified connector according to the present invention in unconnected and connected positions, respectively.

In an alternate embodiment, the two optical pieces depicted in FIGS. 7, 8, and 9 could include all of the hardware that is required to 'snap' the pieces together, as is shown in FIG. 11 where connector 80 includes the functionality of mating connectors 70 and snap connector 72 as shown in FIG. 10.

The embodiment of the preceding example provides for a "daisy chain" arrangement of connections such as one might find in a ring network topology. In a point to point connection, a single bi-directional array would be connected to another single array. An arbitrary number of devices can be connected together similarly. In addition, more than two fiber bundles could be attached to a single array via the same approach allowing star networks and other more complex topologies.

In another embodiment, the image guide can be directly, permanently attached to the emitter/detector array. In this case, only electrical connections must be made.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An optical transceiver connector system for the transmission and reception of light signals, comprising:
    at least one two-dimensional array of optical emitters and detectors mounted on a substrate for said transmission and said reception of said light signals, wherein said substrate incorporates electronic drive circuitry for the electronic control of said emitters and detectors;
    an optical plate for directing said light signals;
    a standoff section disposed between said array and said optical plate; and
    at least one fiber optic bundle for conveying said light signals from/to each of said emitters and detectors, wherein said fiber optic bundle is interconnected to said plate at a first end and wherein a second end interconnects to one or more separate optical plates of one or more separate optical transceivers.

2. The transceiver connector system according to claim 1 wherein said emitters and detectors are integrated devices having varying device heights, and wherein said at least one two-dimensional array is mounted on said drive circuitry of said substrate forming a transceiver array with a common height above said substrate in order to form a common focal plane for said fiber optic bundle.

3. The transceiver connector system according to claim 1, wherein said substrate is an Application Specific Integrated Circuit (ASIC) that is fabricated from the group consisting of: Silicon (Si), Silicon-Germanium (Si—Ge), Silicon-on-Insulator (SOI), Silicon-on-Sapphire (SOS), NMOS/PMOS/CMOS/Bipolar/BiCMOS, Gallium Arsenide (GaAs), and Indium Phosphide (InP).

4. The transceiver connector system according to claim 1, wherein said emitters and detectors are arranged according to a grouping consisting of: two side-by-side arrays, alternating columns, or alternating rows.

5. The transceiver connector system according to claim 1, wherein said emitters are selected from a group consisting of: light-emitting-diodes (LEDs), and vertical cavity surface emitting lasers (VCSELs).

6. The transceiver connector system according to claim 1, wherein said detectors are selected from a group consisting of: photoconducting (PC), and photovoltaic (PV) such as p-i-n photodiodes and metal-semiconductor-metal (MSM) photodetectors.

7. The transceiver connector system according to claim 1, wherein said standoff section is an epoxy.

8. The transceiver connector system according to claim 1, wherein said optical plate is a plurality of microlenses corresponding to a geometry and distribution of said emitters and detectors of said two-dimensional array.

9. The transceiver connector system according to claim 1, wherein said optical plate is a coherent bundle of fibers that transmits light to/from said detectors and emitters.

10. The transceiver connector system according to claim 1, wherein said optical plate is a combination of a plurality of microlenses and a coherent bundle of fibers.

11. The transceiver connector system according to claim 1, wherein said optical plate is an optically transmissive medium that prevents direct physical contact between said fiber optic bundle and said emitters and detectors, protecting the emitters and detectors from physical damage and from contaminants.

12. The transceiver connector system according to claim 1, wherein said at least one fiber optic bundle is a glass/polymer image guide or ordered fiber array.

13. The transceiver connector system according to claim 12, wherein a spatial ordering of said glass/polymer image guide or ordered fiber array is produced by a fiber drawing process or by terminating an array of fibers in a precision ferrule or fiber alignment plate.

14. The transceiver connector system according to claim 1, wherein said standoff section is disposed within said array.

15. The transceiver connector system according to claim 1, wherein said standoff section is wholly surrounding a periphery of said array.

16. The transceiver connector system according to claim 1, wherein said standoff section is partially surrounding a periphery of said array.

17. The transceiver connector system according to claim 1, wherein said second end of said fiber optic bundle is has a pigtail separating said bundle to two or more separate optical transceivers.

18. The transceiver connector system according to claim 1, wherein said standoff is part of said optical plate.

* * * * *